United States Patent [19]
Merrell

[11] 4,090,143
[45] May 16, 1978

[54] DIGITAL PHASE COMPARATOR WITH RESET

[75] Inventor: Richard G. Merrell, Darien, Ill.

[73] Assignee: Zenith Radio Corporation, Glenview, Ill.

[21] Appl. No.: 756,166

[22] Filed: Jan. 14, 1977

[51] Int. Cl.² ............................................. H03D 13/00
[52] U.S. Cl. ...................... 328/134; 307/215; 307/232
[58] Field of Search ................ 328/133, 134; 307/215, 307/232

[56] References Cited

U.S. PATENT DOCUMENTS

| | | | |
|---|---|---|---|
| 3,501,701 | 3/1970 | Reid | 328/134 |
| 3,610,954 | 10/1971 | Treadway | 328/133 X |
| 3,626,307 | 12/1971 | Koyama | 328/133 |
| 3,755,746 | 8/1973 | Hogue | 328/134 X |

*Primary Examiner*—John S. Heyman

*Attorney, Agent, or Firm*—Nicholas A. Camasto

[57] ABSTRACT

An all-channel PLL tuning system includes LOF counters, a comparator producing an equality pulse each time the LOF count matches a preselected channel number count and a digital phase-frequency comparator comparing the equality pulses with reference pulses. High speed tuning is accomplished with the phase-frequency comparator arranged to yield immediate correct directional information. A reset pulse is generated for every other equality pulse and forces the equality and reference pulses to have the same initial phase and the digital phase-frequency comparator into one of its stable states corresponding to the desired output condition. The output directional information from the phase comparator is stored and tuning proceeds at high speed until a change in directional information occurs, indicating that the correct tuning frequency has been passed. Normal PLL operation then ensues.

6 Claims, 9 Drawing Figures

FIG. 5.
RAMP CONTROL 35

FIG. 4.
PHASE COMPARATOR 40

FIG. 6.

| QF-E_P 0-0 | QF-E_P 0-1 | QF-E_P 1-1 | QF-E_P 1-0 | U | D |
|---|---|---|---|---|---|
| (1) | 2 | 3 | (4) | 0 | 1 |
| 5 | (2) | (3) | 8 | 0 | 1 |
| (5) | 6 | 7 | 8 | 1 | 1 |
| 9 | (6) | 7 | 12 | 1 | 1 |
| 5 | 2 | (7) | 12 | 1 | 1 |
| 1 | 2 | 7 | (8) | 1 | 1 |
| (9) | (10) | 11 | 12 | 1 | 0 |
| 5 | 6 | (11) | (12) | 1 | 0 |

FIG. 7.

DIGITAL PHASE COMPARATOR WITH RESET

CROSS REFERENCE TO RELATED PATENT & APPLICATION

This application is directed to subject matter originally disclosed in application Ser. No. 734,483, dated Oct. 21, 1976, in the name of Richard Merrell and assigned to Zenith Radio Corporation, which application is hereby incorporated by reference.

BACKGROUND OF THE INVENTION

The invention relates to high speed all-electronic digital phase lock loop (PLL) television tuning systems. Specifically, the invention is concerned with the phase-frequency comparator therein.

DESCRIPTION OF THE PRIOR ART

While the copending related application discloses a phase-frequency comparator identical to that of the preferred embodiment, its claims are directed to a high speed television tuning system. In this context, high speed refers to overall channel acquisition time, that is, the maximum time it takes to tune between any two channels. The tuning system includes a PLL for controlling ramping speed, i.e. how rapidly the tuning voltage, which controls the oscillator frequency, is changed. Because of the relatively low frequency comparison rate, (dictated by the non-sophisticated logic used in the channel counters) conventional PLL systems are not as fast as one would like. A 200 ms (millisecond) channel acquisition time was established as being most desirable since, while the channel changes would appear instantaneous to the viewer, he would be able to visually determine what programs were being received on each channel as he operated the system to scan the channels. This is accomplished by initially forcing high speed or 100% ramping, until system tuning is driven just beyond the frequency corresponding to the selected channel number, and thereafter allowing normal PLL operation. The initial rapid tuning of the system materially shortens channel acquisition time by bringing tuning close to that desired before allowing the relatively slow PLL operation to commence. Specifically tuning cycle control means were incorporated to put the system into its full or high speed ramp mode when a channel change indication occurred. While there are other implementation techniques available, the preferred embodiment of that invention incorporated the phase-frequency comparator arrangement of this invention.

The phase-frequency comparator of the invention has a plurality of logic gates interconnected to selectively produce up and down output signals as a function of the phase-frequency relationship between an adjustable signal and a reference signal. The adjustable signal is related to the local oscillator frequency and the reference signal is derived from a suitably controlled frequency source. The comparator structure is substantially disclosed in a device marketed by Motorola under the designation MC4344-MC4044.

Digital phase-frequency (comparators) are well-known in the art and have a plurality of unstable states as well as a plurality of stable states. When in an unstable state, they may produce inaccurate output information. Fortunately, they are in unstable states for only relatively short periods of time after energization. In normal use arrangements, a sufficient time period is allowed to elapse to assure that the information produced at their outputs is accurate and reliable.

In the high speed tuning system disclosure of the copending application, means were shown for developing a reset pulse for the digital phase-frequency comparator while simultaneously forcing the adjustable signal and reference signal to have the same phase. The comparator is thus forced to one of its stable states corresponding to the desired output from the direction terminals. With this technique the detector immediately yields correct directional information for the ramp control circuitry based upon the difference in frequency between the adjustable and reference signals. The system is then forced into full ramping in the indicated direction and held in that condition until the comparator produces a directional output indicating that the desired frequency has been passed. This is accomplished by continually resetting the phase-frequency comparator of the invention, (forcing the phase of the adjustable and reference signals to be the same) until a reversal of directional output is obtained. Then the phase-frequency comparator is allowed to operate as part of a conventional PLL.

OBJECTS OF THE INVENTION

An object of this invention is to provide a novel digital phase-frequency comparator.

Another object of this invention is to provide a phase-frequency comparator which immediately yields correct directional information.

SUMMARY OF THE INVENTION

In accordance with the invention a digital phase-frequency comparator includes a plurality of logic gates interconnected to yield directional information based upon the frequency and phase differences between an adjustable signal and a reference signal. Means are provided for operating the phase-frequency comparator to immediately yield correct directional information as to the frequency difference between the two signals within one cycle of the higher frequency signal.

BRIEF DESCRIPTION OF THE DRAWINGS

Further objects and advantages of this invention will be apparent from reading the following specification in conjunction with the drawings in which.

LOGIC DEFINITIONS

For simplicity, only logic connections are shown in the figures and only voltage sources and grounds necessary to establish the logic control signal levels are shown. Positive logic is used throughout and logic gates are generally referred to by their functional names only, i.e., AND, NAND, OR, NOR and EXCLUSIVE OR. A "1" represents a high logic signal and a "0" corresponds to a lower logic signal. Thus, an AND gate has its output at 1 only if all inputs are at 1; a NAND gate has its output at 0 only if all inputs are at 1; an OR gate has its output at 1 if any input is at 1; and a NOR gate has its output at 0 if any input is at 1. Inverters function to interchange the 1 and 0 levels. An EXCLUSIVE OR has a 0 at its output only when signals at all inputs are at the same level.

Leads may be identified by the functional signals they carry. For convenience, leads connected to parts in another figure, in addition to their normal designations will, where practical, be followed by the appropriate figure number enclosed in brackets. The additional designation of "FROM" and "TO" indicate the source or destination of logic signals or connections.

The terms "input" and "output" generally indicate a device terminal unless signal is specified. $\phi$ generally represents a timing pulse signal and $\bar{\phi}$ its inverse or complement. If $\phi$ is 0, $\bar{\phi}$ is 1 and vice-versa. The term "inhibit" indicates the condition in which a gate output is no longer dependent upon signals applied to its remaining inputs. The term "enable" designates the condition in which a gate output is dependent upon the signals applied to its remaining inputs.

Flip flops will be referred to by the letters FF. Drawing representations of flip flops are those commonly used with the lead locations indicating the terminal as shown for flip flop 300. The word terminal is omitted in most instances. For example, the "J and K terminals of flip flop 300" will be referred to as "J, K of FF 300". Any unspecified Set (S) or Reset (R) terminals are connected to 0 and all unspecified J or K terminals are connected to 1. All flip flops of the J-K type are similar to RCA type CD 4027.

DESCRIPTION OF THE PREFERRED EMBODIMENT

General Operation of the Tuning System

The system has two tuning modes, characterized as a "single frequency" mode and a "tuning window" mode. It incorporates local oscillator frequency (LOF) counters, including a modular scaler, for deriving the channel number corresponding to system tuning, a channel number comparator, a ramp control and tuning voltage source, means for generating desired channel numbers, a reference signal, an AFC circuit, a channel number display, a tuning cycle control and a phase-frequency comparator to which the present invention is directed. The phase-frequency comparator is often referred to simply as a phase comparator for brevity. When a channel change is initiated, the system goes into full ramping, senses when the desired frequency has been passed, operates for a fixed time in the single frequency mode (with a PLL) and releases to its tuning window mode with AFC. The invention is directed to use of the phase-frequency comparator during 100% ramping (i.e. driving the varactor controlled oscillator to rapidly change frequency) to determine proper direction until an overshoot condition is detected, which shortens the channel acquisition or tuning time.

In the single frequency mode, the PLL is operational and the LOF channel counters continuously count the LOF pulses. The channel number comparator compares the LOF count number with the desired channel number input, supplying an equality pulse Ep to the phase-frequency comparator (and resetting the channel counters) each time there is equality. The resetting is done between LOF pulses. The phase comparator is also supplied with a reference timing signal of approximately 1KHz (actual frequency is 976.5625Hz). The phase comparator compares the frequency and phase of the train of equality pulses from the channel number comparator with the frequency and phase of the 1KHz reference timing signal.

The phase comparator output supplies the ramp control which, in turn, operates on the tuning voltage source for controlling system tuning. If the timing signal reference frequency is higher than the frequency of the train of equality pulses, the LOF is lower than the frequency corresponding to the desired channel number. Similarly, if the frequency of the train of equality pulses is higher than the timing signal reference frequency, the LOF is too high.

The LOF counters are under the control of counting logic. The counter presets are loaded during resetting of the counters between successive LOF pulses, thus insuring that all LOF pulses are counted. During single frequency operation a single residue state of the modular scaler is selected. Thus a comparator equality pulse occurs only when the units and tens counters correspond to the selected channel number tens and units digits and the state of the modular scaler indicates the predetermined residue.

Tuning is complete when the LOF is set to the appropriate frequency dictated by the desired channel number supplied to the comparator. No signal is required. When the system has been in its initial single frequency tuning mode for a predetermined time, the counting logic is reconfigured, the system goes into its tuning window mode and the AFC is enabled. The initial-mode time interval is sufficient to insure PLL tuning to the frequency corresponding to the desired channel number.

It will be appreciated that for purposes of the present invention, it matters not whether the tuning system goes into a tuning window mode or remains in a PLL mode. As disclosed, a tuning window mode follows the 100% ramping operation and timed PLL operation.

As is well-known, a tuning frequency window is conveniently established by asynchronous sampling of the channel counters and specifying more than one acceptable residue or state of the modular scaler. Proper tuning is indicated when the sampled LOF count satisfies the units and tens counters and the preselected residues. See U.S. Pat. No. 3,961,266 to Akio Tanaka. The counting logic establishes count, compare and reset intervals for asynchronous sampling of the LOF. The LOF pulses are counted during the count intervals and comparison between the derived channel number count and the selected channel number from the channel number latch is carried out during compare intervals. During reset intervals, the counters are reset and loaded for the next count interval.

If tuning should go outside the window for any reason, or if a channel change initiate (CCI) signal is generated, the tuning cycle control is activated to return the system to full ramping and then to single frequency PLL operation. After the allotted time for single frequency operation, the system again reverts to its normal tuning window mode with AFC control restored.

In the PLL mode the channel number comparator produces an equality pulse for the phase comparator and the phase comparator produces the ramp control voltage for the tuning voltage source. The channel number comparator also sends either an equality or inequality pulse (Ep or IEp respectively) to the tuning cycle control. The channel number comparator doesn't directly control the tuning voltage source.

DETAILED DESCRIPTION

Figure 1:
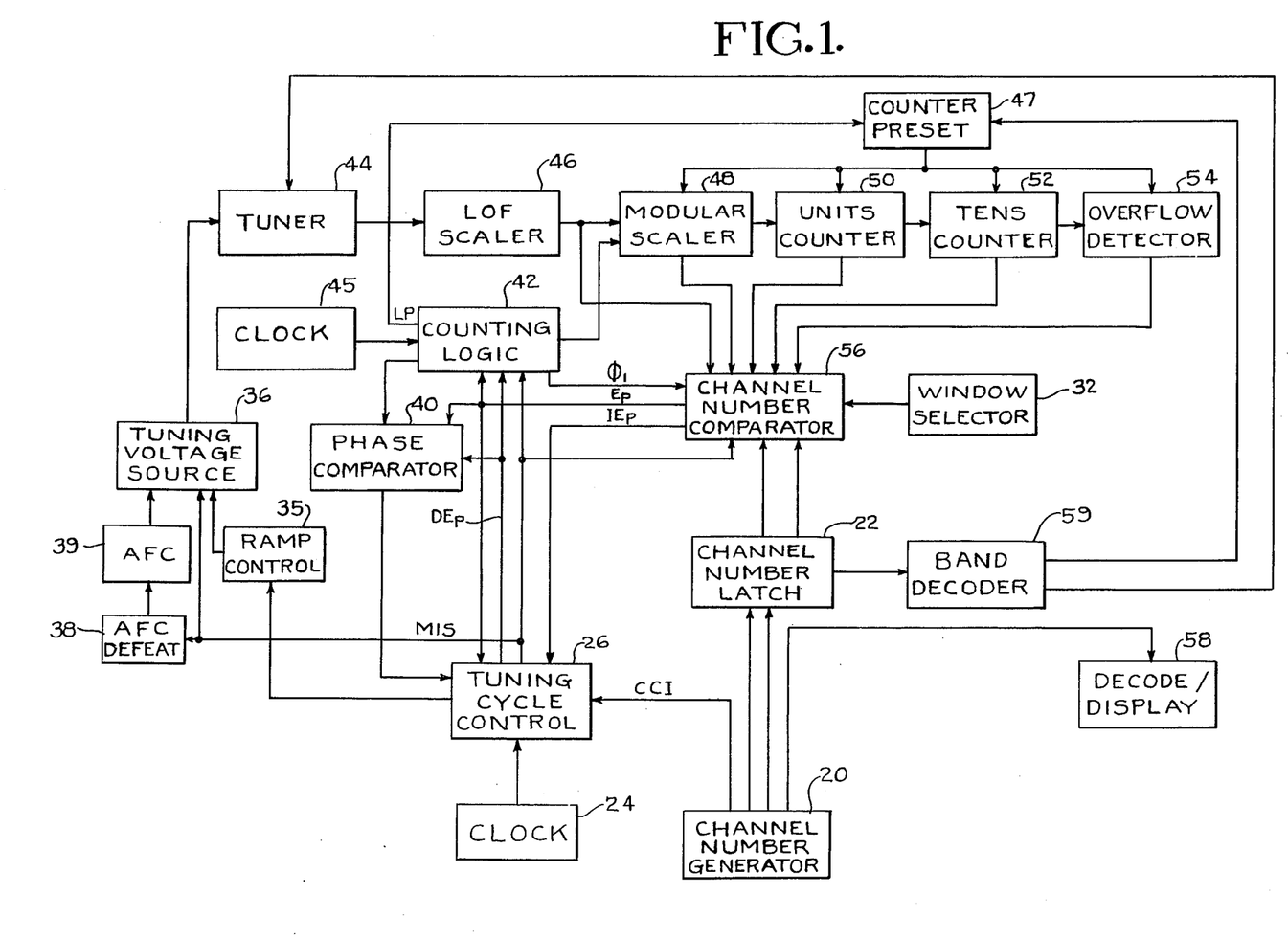
FIG. 1 is a block diagram of a television tuning system employing the phase-frequency comparator of the invention.

FIG. 1 is a block diagram of the tuning system constructed in accordance with the invention. A channel number generator 20 includes means for generating a desired two digit channel number for tuning the system. Number generator 20 may include encoding circuitry for producing special binary representations of the channel number in the tuning system and has means for producing a channel change initiate (CCI) signal in response to any new channel number input. The generator is coupled to a channel number latch 22, which temporarily stores the input information, and to a tuning cycle control 26 for sequencing the system through its tuning modes. Number generator 20 is also coupled to a Decode/Display 58 for displaying the selected channel number.

Number generator 20 may include a keyboard, or a memory system for generating preselected number upon command - either locally or by remote control. A particularly attractive system is described and claimed in a copending application Ser. No. 621,911 filed 10-14-75 in the name of Akio Tanaka in which a simple number generator is used with an "82×1" memory programmed with simple "stop or go" information. Such a memory is programmed by the user to sequentially produce whatever channel numbers are desired.

Tuning cycle control 26 is coupled to a ramp control 35, a phase comparator 40, and supplies a mode identification signal (MIS) to a tuning voltage source 36, an AFC defeat 38, a counting logic 42, and a channel number comparator 56. A timing signal from clock 24 is supplied to tuning cycle control 26. A source of AFC voltage 39 is coupled between AFC defeat 38 and the tuning voltage source 36 which is also supplied from ramp control 35. Tuning voltage source 36 supplies DC tuning voltages for the local oscillator, mixer and amplifier stage (all not shown) in a tuner 44.

A clock 45 drives counting logic 42, which is coupled to phase comparator 40, a modular scaler 48, a counter preset 47, and channel number comparator 56. Tuner 44 is coupled to a LOF scaler 46 which is in turn coupled to modular scaler 48 and channel number comparator 56. Scaler 48 drives a units counter 50, which drives a tens counter 52, which in turn drives an overflow detector 54. The modular scaler, units and tens counters and overflow detector are often referred to as the LOF counters. Each of scaler 48, units counter 50, tens counter 52 and overflow detector 54 is coupled to channel number comparator 56 and counter preset 47. Channel number latch 22 is coupled to channel number comparator 56 and to a band decoder 59. Band decoder 59 is coupled to counter preset 47 and tuner 44 and supplies presets to the counters based upon the frequency range of the signal corresponding to the selected channel number and an appropriate signal to the tuner for determining VHF or UHF operation. Lastly a simple window selector 32 is coupled to channel number comparator 56.

The LOF scaler is shown in block form since it is well-known in the art. In particular, reference may be made to the previously mentioned Tanaka patent. Briefly, the local oscillator frequency is divided by 1024 in the LOF scaler. The divide or scaled LOF output is supplied to a series of interconnected flip flops (not shown) arranged to perform successive division operations to derive the channel number. Each of the counters is serially connected so that the output of each set of flip flops is the input of the next set of flip flops, forming a familiar counter chain.

Because of the 6MHz spacing between adjacent TV channels, (i.e., between the picture carriers of adjacent channels), within each of the four discontinuous television frequency bands, modular six arithmetic becomes of particular significance since a complete cycling of the modular scaler corresponds to a 6MHz change in LOF (i.e. one channel) and each state thus represents a 1MHz interval.

In the preferred embodiment, six cycles of input to the LOF scaler give one cycle of output to the modular scaler, which changes state for each cycle of input. Proper selection of its presets for each band enables its state to consistently reflect incremental tuning within each channel throughout the tuning spectrum. The modular scaler information is supplied as incremental additions to the units counter and adds to its preset count. Similarly, cycling of the units counter drives the tens counter, adding to its preset. The channel number corresponding to system tuning is in the channel number latch (or number generator 20) in binary form and a visible readout may be readily presented to the viewer.

The local oscillator frequency of the tuner is thus divided down by LOF scaler 46, modular scaler 48, and counters 50 and 52 to derive the channel number corresponding to system tuning. The information is supplied to the channel number comparator for comparison with the desired channel number from the channel number latch. Any input of a new desired channel number initiates a tuning cycle and produces a CCI signal.

Clock 45 supplies timing pulses to counting logic circuit 42 for establishing the timing intervals for asynchronous sampling and provides a reference frequency signal for the phase comparator during the single frequency tuning mode. In this mode, the counters count LOF pulses and are reset each time channel number comparator 56 indicates equality between the derived and desired channel numbers. Each time equality is determined an equality pulse is supplied to phase comparator 40 which compares them for phase and frequency coincidence with timing pulses from counting logic 42. Depending upon the result of the phase comparison, ramp control 35 operates on the tuning voltage source to drive tuner 44 in an appropriate direction to minimize the phase comparator error. Single frequency tuning is accomplished by determining one residue of the modular scaler, which in conjunction with the units and tens counters registers equality at only one frequency. The system is tuned at "full speed" unitl an "overshoot" condition is detected indicating the correct tuning position has been passed. Then a fixed time period is allocated for operation of the phase lock loop. This time period is determined by clock 24, operating through tuning cycle 26, which controls tuning sequencing.

After the predetermined time allocated for the single frequency mode PLL has elapsed, counting logic circuit 42 reconfigures the counters for asynchronous sampling counting to produce the tuning window mode. The AFC is also enabled in this mode. In the tuning windowed mode timing circuits establish separate count, compare and reset intervals.

In the single frequency mode, channel number comparator 56 compares the derived channel tuning information based upon the LOF, with the desired channel number from the channel number latch on an elapsed time basis. That is, each time the desired number is counted a pulse is sent and a comparison of frequency and phase with a reference pulse is made. It thus determines equality between the tens and units digits of the received and desired channel numbers and if the residue of the modular scaler corresponds to the predetermined one. It may also include circuitry, for guarding against an erroneous comparison signal based upon an indeterminate condition which could occur during mode changing.

In the tuning window mode, a derived channel number, representative of actual system tuning, is supplied to comparator 56 on a time sample basis where it is compared with the desired channel number from latch 22 during a "compare" interval. During each reset interval the counters are loaded with their preset information in preparation for the next count interval. The Inequality pulse (IEp) output of channel number comparator 56 is connected to tuning cycle control 26 and activated during the "compare" interval. As long as the channel number comparator indicates that the tuning frequency is within the window no IEp pulse is produced and the system stays in the tuning window mode. If system tuning goes outside of the window, an inequality pulse is sent to tuning cycle control 26 to reinitiate full ramping and the single frequency tuning mode as though a new channel number input had been made.

AFC 39 is enabled in the tuning window mode, through defeat logic 38, to operate normally; tracking the received signal and maintaining system tuning by supplying any required correction voltage to tuning voltage source 36.

Figures 2, 3:
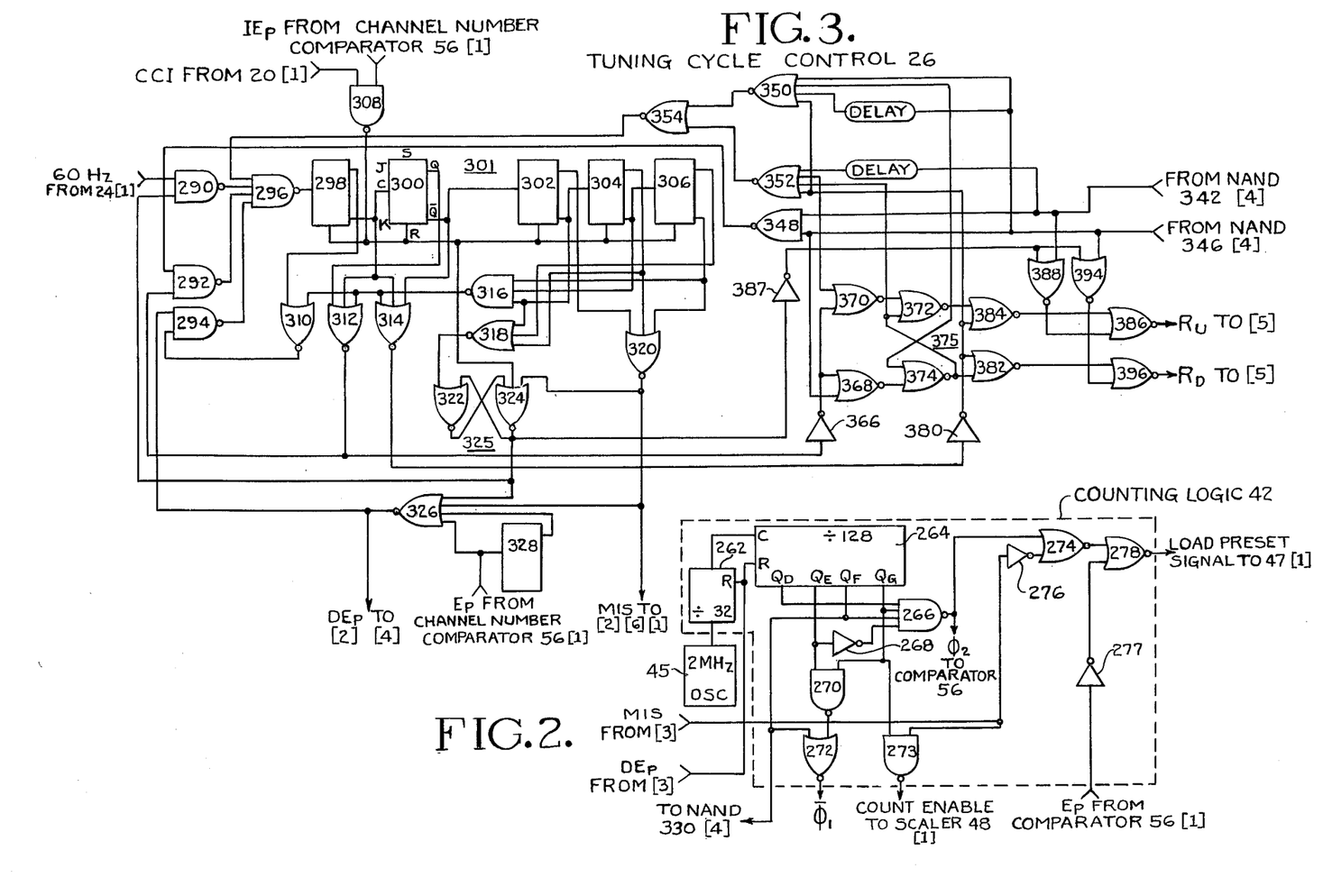
FIG. 2 is the detail logic circuit of counting logic 42.
FIG. 3 is the detail logic circuit of tuning cycle control 26.

Counting Logic 42 (FIG. 2)

The counting logic circuitry is described in detail in the above-mentioned copending application. For the sake of brevity, it will be described only functionally with respect to the present invention.

Counting logic 42 comprises a series of interconnected flip flops producing timing pulses for the tuning system. It is driven by a 2MHz clock 45 and, by successive division, develops various timing pulses. The signal $Q_F$ establishes a fixed reference frequency for phase comparator 40. The $\phi_2$ timing pulse resets the LOF counters when the system is in the tuning window mode. The signal $Q_G$, operating through NAND 273 and in conjunction with the MIS signal, establishes the count interval for asynchronous sampling to establish the window. $\phi_1$ establishes the compare interval. LP at the output of NOR 278 enables a series of NOR gates in counter preset 47 to permit loading of the preset information into the LOF counters and the output of NAND 273 supplies the count enable pulse.

A 2MHz pulse train from clock 45 drives a divide-by-32 counter 262. The output of the counter is supplied to the clock terminal of a divide-by-128 counter 264. Both counters may consist of suitably interconnected flip flops. A signal DEp (divided-down-equality pulse) is coupled to the reset terminals of counters 262 and 264. $Q_D$, $Q_E$, $Q_F$ and $Q_G$ of counter 264 represent outputs corresponding respectively to the input being divided by 16, 32, 64 and 128. The output of NOR 272 determines signal $\bar{\phi}_1$. Signal $\phi_2$ is developed at the output of NAND 266. $Q_F$ supplies the 1KHz reference signal for phase detector 40 in FIG. 4. The output of NOR 278 is the load preset signal LP.

Tuning Cycle Control 26 (FIG. 3)

Tuning cycle control 26 determines the operational sequencing of the system in response to either a CCI signal, upon entry of a channel number, or an IEp signal, indicating that system tuning is outside the range defined by the window. As with the counting logic 42, tuning cycle control will be described in functional terms only. Essentially the tuning cycle control is a plurality of flip flops interconnected as a counter whose states provide various timing intervals developed from clock 24.

The system initially obtains ramp direction information from the phase comparator of the present invention (while inhibiting PLL operation), drives the ramp at full speed until an "overshoot" condition is detected and then lets the PLL operate for a sufficient time to assure single frequency tuning. The ramp drive is essentially latched up in one direction until the correct frequency has been passed — which indicates system tuning is close to the desired frequency. Then the PLL is enabled and allowed to operate for the allotted time period before the system is released to its tuning window mode. It may be noted that the term "full ramp" or "100% ramping" refers to supplying a continuous, that is D.C., ramp control voltage. In PLL operation, the phase comparator delivers a pulsed ramp control voltage with a relatively low duty cycle. The tuning cycle control is supplied 60Hz from clock 24, ramp control voltages from phase comparator 40, Ep and IEp signals from channel number comparator 56 and a CCI signal from channel number generator 20.

The tuning cycle control supplies the MIS signal, the DEp signal, and the ramp drive signals $R_U$ and $R_D$. In PLL operation the ramp drive signals are of low duty cycle and produce a relatively slow tuner response. During 100% ramping the tuning cycle control develops a very high duty cycle pulse (100% or D.C. in the preferred embodiment) for driving the tuner at a higher rate.

NOR's 350, 352 and 354 provide the "overshoot" detection function for indicating when system tuning has passed the desired point during full ramping. NOR's 368 and 370, in conjunction with RS FF 375 and NOR's 382 and 384 provide the mechanism driving the ramp fully in the desired direction. When NOR's 382 and 384 are enabled by Inverter 380 being at 0 the ramp control signal NOR's 388 and 394 are inhibited. RS FF 325 enables NOR's 388 and 394 as counter 301 is advanced from its state 4 to state 15 to carry out PLL pulsed ramping. NAND 316 and NOR 318 are decoders for the counter states, as are NOR's 310, 312 and 314 with the latter also directing counter state changes. NAND's 290–296 perform the changes. NOR 320 produces the MIS signal based upon the states of FF's 302–306 in the counter which is timed from the 0 state to state 15 of counter 301.

The counter flip flops have a total of 32 states, with state 0 being the reset. NOR 310 decodes state 0 and enables NAND 294. During this state the DEp pulse resets the counters in counting logic 42, resets the phase comparator and advances counter 301 from 0 to state 1.

NOR 312 detects state 1 and enables NAND 292 to subsequently advance the counter to state 2 and, through Inverter 366, enables directional NOR's 368 and 370 causing appropriate setting of RS FF 375 to supply full ramp control voltage. The ramp direction information is received from the phase comparator. In state 2, NOR 310 again enables NAND 294. The DEp signal is again produced, resetting the counting logic and the phase comparator and advancing counter 301 to state 3.

NOR 314 detects state 3 of counter 301 and enables the ramp override NOR's 382 and 384 and the overshoot detection NOR's 350 and 353 to generate full ramp tuning voltage and to detect passing the correct numbers in the channel number comparator, which indicates system tuning has gone beyond the desired frequency. When this occurs, counter 301 is advanced to state 4 by NOR 354 activating NAND 296.

NOR 318 detects state 4 and sets RS FF 325 to maintain NAND 290 enabled for counting and for enabling the normal ramp control signal NOR's 388 and 394. Counter 301 is advanced from state 4 to state 16 by the 60Hz pulses from clock 24, providing an approximate 200ms period during which PLL signal frequency tuning is accomplished. The period is sufficiently long to bring the system to the frequency corresponding to any FCC allocated channel. When state 16 is reached, NOR 320 resets RS FF 325, terminating further clock pulses to counter 301.

Figure 4:
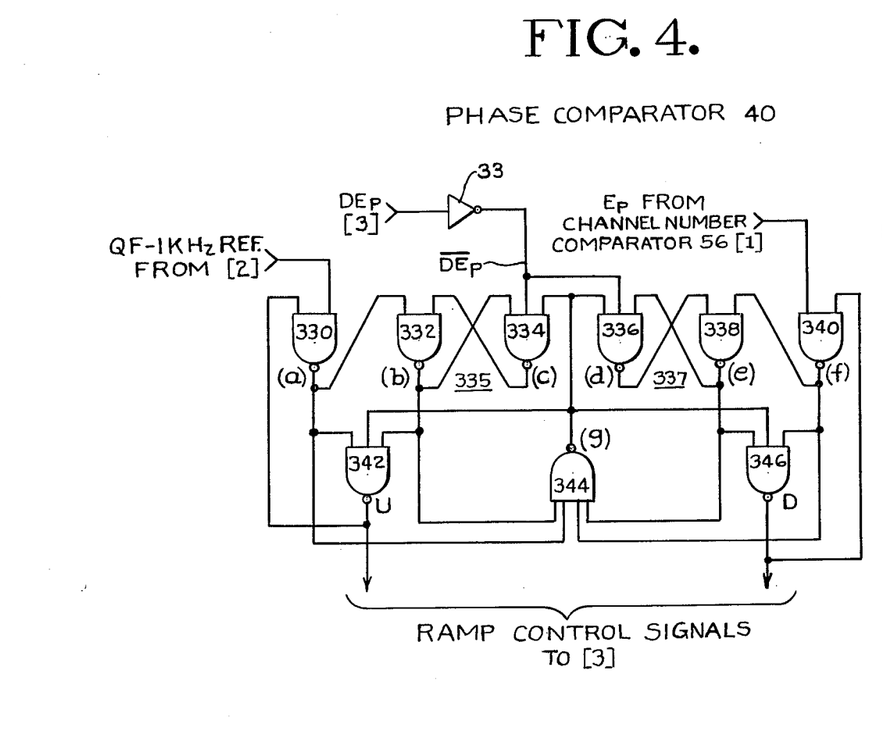
FIG. 4 is the detail logic circuit of phase-frequency comparator 40 of the present invention.

Phase Comparator 40 (FIG. 4)

The phase comparator determines whether the LOF is above or below the desired frequency. The timing signal of counting logic counter is a 1KHz fixed frequency pulse train which is used as the phase comparator reference frequency. Its other input is the Ep signal which is a series of pulses produced by the channel number comparator indicating equality between the desired channel number and derived channel number. As described, while the phase comparator continues to operate, the PLL is inhibited during the tuning window mode and during full ramping. The phase comparator itself is well-known in the art. The Motorola device, designated MC4344·MC4044, is logically equivalent, although the voltage levels are not correct for this application.

The $Q_F$ output of counting logic counter 264 (FIG. 2) is coupled to a first input of a NAND 330, the output of which connects to a first input each of NAND's 342 and 344 and the input of an RS FF 335 comprising cross coupled NANd's 332 and 334. Signal Ep from the channel number comparator (FIG. 1) is coupled to a first input of a NAND 340, the output of which is coupled to a first input of a NAND 346, a second input of NAND 344 and to the input of RS FF 337 comprising cross connected NAND's 336 and 338. Signal DEp is coupled, through an Inverter 33 (output $\overline{DEp}$) to a second input each of NAND's 334 and 336.

The output of RS FF 337 is coupled to a second input of NAND 346 and to a third input of NAND 344. The output of RS FF 335 is coupled to a second input of NAND 342 and a fourth input of NAND 344. The output of NAND 344 is coupled to the remaining inputs of NAND's 334, 336, 342, and 346. NAND 346 is coupled to the last input of NAND 340 and NAND 342 to the last input of NAND 330. The output of NAND 342 is labelled U and that of NAND 346 labelled D. They supply the ramp turn-on or control signals to tuning cycle control 26 (FIG. 3). If the reference signal frequency is greater than the frequency of Ep, NAND 342 sends a Up ramp signal to adjust the tuning voltage. As will be explained in greater detail, in accordance with the invention, the DEp signal resets the phase comparator so that it starts from the correct state and gives a correct direction signal immediately. The various NAND outputs have been labelled from (a) to (g) U and D, and will be referred to latter. A characteristic of phase comparator of the type used in the invention is that they produce "glitches" or small voltage spikes while internally going through state changes. To preclude interpretation of such glitches as direction information, the delays to NOR's 350 and 353 in tuning cycle control 26 (FIG. 3) are included.

Figure 5:
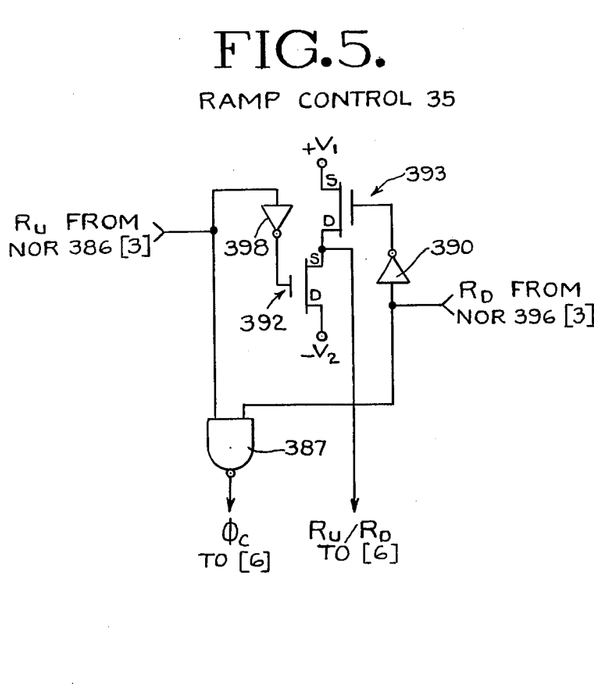
FIG. 5 is the detail logic circuit of ramp control circuit 35.

Ramp Control 35 (FIG. 5)

Ramp control 35 operates in conjunction with a voltage divider circuit to adjust the LOF through tuning voltage source 36, and thereby change system tuning. The ramp control signal is directly dependent on the output of phase comparator 40 as made available to it by tuning cycle control 26. The ramp control is only active during 100% ramping and the single frequency mode, the AFC circuit making minor adjustments to the tuning voltage control during the tuning window mode. NOR's 386 and 396 from the tuning cycle control respectively supply the two inputs of a NAND 387 and, through Inverters 390 and 398 respectively supply the gate electrodes of FET's 392 and 393.

A source of +5V is coupled to the source electrode of FET 393, and −12V is coupled to the drain electrode of FET 392. The drain electrode of FET 393 and source electrode of FET 392 are coupled together and the ramp control signals $R_U/R_D$ taken from this junction and applied to the tuning voltage source in FIG. 6. The actual ramp control signal is taken from the common terminal of the two FET's and corresponds approximately to $+V_1$ for a $R_D$ signal, $-V_2$ for a $R_U$ signal and an open circuit in its third state. The ramp signal is supplied to one input of an OTA in the tuning voltage source (FIG. 1) along with a timing signal obtained from NAND 387, indicating occurrence of a ramp signal. Thus ramp control 35 appropriately enables tuning voltage source 36 when a $R_U$ or $R_D$ signal is produced.

Phase Comparator Analysis (FIGS. 6–9)

Figure 6:
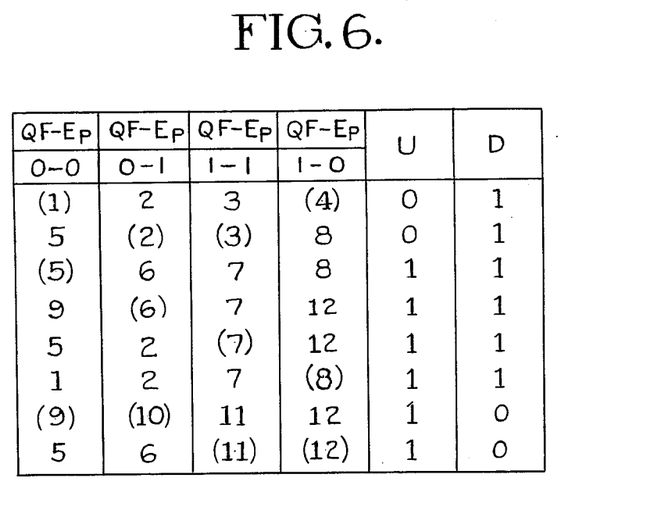
FIG. 6 is a flow table for a phase detector of the type used in the invention showing the inter-relationship between the detector inputs, outputs and states.

FIG. 6 is a table showing the stable and unstable states of the phase comparator of the invention. The table is taken from the literature accompanying the MC4344·MC4044 phase-frequency detector with the exception that the input and output terminal designations have been conformed to those used in the description of the invention. The numbers indicate all of the device states with the parentheses denoting its stable states. The 0's and 1's indicate logic levels with 0 being low and 1 being high. It will be noted that for U and D at 1, there are four stable states: namely (5), (6), (7) and (8).

Figure 7:
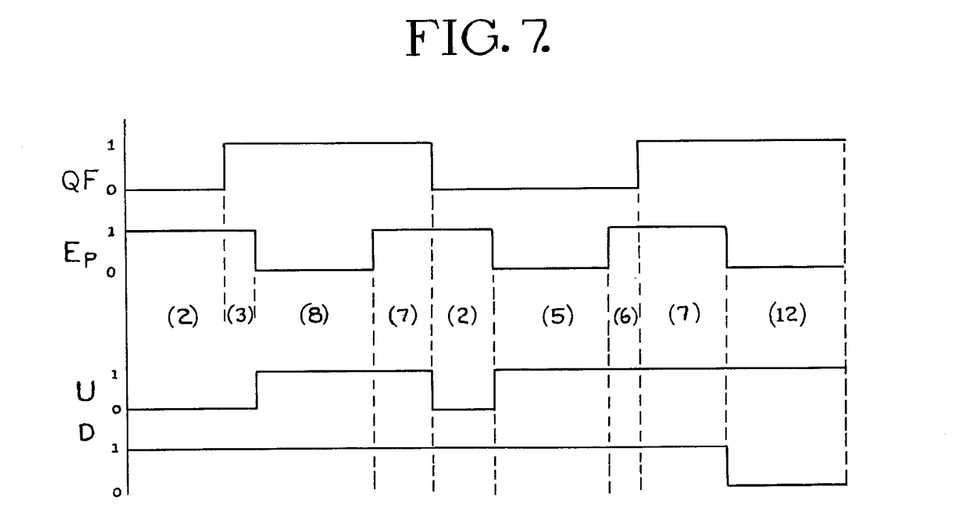
FIG. 7 is a graph of QF and Ep waveforms for an assumed set of conditions illustrating the erroneous output information.

FIG. 7 shows waveforms for QF, Ep, U, and D, for an MC4344·MC4044 type phase-frequency detector. The initial condition of the phase detector has been arbitrarily assumed to illustrate the point that it can yield incorrect directional information. The time required before reliable information is obtained is a function of the frequency difference between QF and E$p$ (reference frequency and variable frequency) and increases as the frequency difference decreases. Reference is made to the table in FIG. 6.

For any given conditions of QF and E$p$ the phase detector can be in any of three of its twelve stable states. As changes occur, the states are determined by moving horizontally from the present state to the column corresponding to the new QF-E$p$ conditions. If a stable state is encountered, the U, D outputs may be read directly. If an unstable state is encountered, the detector moves to the same-numbered stable state. This is performed on the table by moving vertically to the stable state of the same number. The U and D outputs are then determined.

In FIG. 7, QF is 0, E$p$ is 1, U is 0 and D is 1, based on the assumption that the phase detector is in stable state (2). Locating this point on FIG. 6, the next change in FIG. 7 is that QF goes to 1. Moving horizontally to QF-E$p$ = 1—1 column encounters stable state (3). (No change in U, D). From FIG. 7, the next change is that E$p$ goes to 0, which puts it in unstable state 8. Moving vertically downward to stable state (8) yield a U at 1, D at 1 output condition — a change. Continuing on, the next change is that E$p$ goes to 1 which, from the table, puts the detector in stable stage (7) via unstable state 7. U and D remain at 1. The next change is QF going to 0, putting the detector back into stable state (2), via unstable state 2, and yielding a U at 0, D at 1 pair of outputs — a change. Continuing on, it can be readily shown that stable state (12) is reached at which D is at 0 and U at 1 — a complete reversal. Since the frequency difference between QF and E$p$ has not changed, the detector has given erroneous output information. Carrying the process on will eventually result in only correct directional information — but it takes time.

It will now be shown how the invention precludes such erroneous information by resetting the phase comparator into one of its stable states corresponding to a set of desired output conditions.

Figure 8:
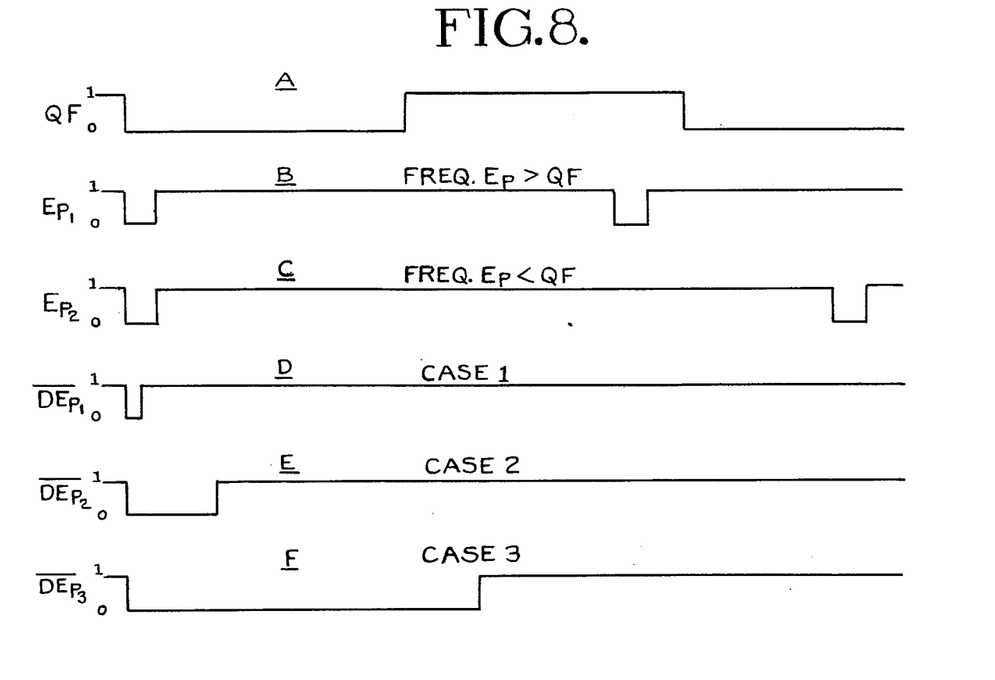
FIG. 8 is a graph of waveforms useful in understanding the invention.

In FIG. 8 a number of pulse waveforms are shown. The 1KHz reference QF is curve A, curves B and C are for two different frequency equality pulses E$p_1$ and E$p_2$ and curves D, E and F represent three different durations of divided-down equality pulses $\overline{DEp_1}$, $\overline{DEp_2}$ and $\overline{DEp_3}$ for the phase comparator of the invention. The $\overline{DEp}$ pulse serves as a reset and curves D, E and F will thus be seen to represent the three possibilities, or Cases, regarding termination of the $\overline{DEp}$ reset pulse with respect to the equality and reference pulses. In Case 1 $\overline{DEp_1}$ is a short duration reset pulse which terminates when both the reference pulse and equality pulse are at 0. This is indicated by curves A, B, C and D. In Case 2 the reset pulse terminates when the reference pulse is at 0 and the equality pulse is at 1 (curves A, B, C and E). Finally, in Case 3 the reset pulse terminates while both the reference pulse and equality pulse are at 1 (curves A, B, C and F).

Figure 9:
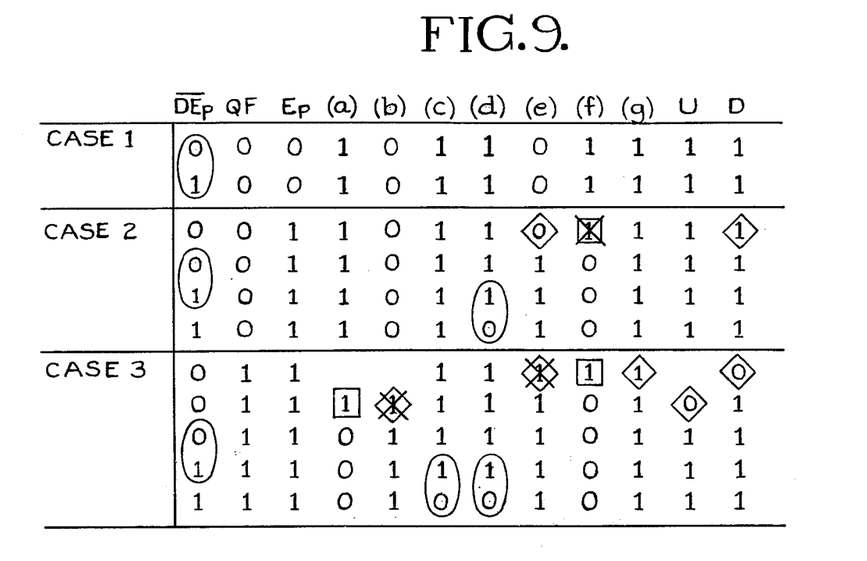
FIG. 9 is a table showing the stable states that the phase-detector of the invention is driven to for providing immediately accurate directional information.

The table in FIG. 9 lists the various logic levels for $\overline{DEp}$, QF, E$p$ and the lettered outputs ($a$-$g$, U and D) of the NANDS in phase comparator 40. A square indicates an assumed level; a diamond indicates a derived level; and an X indicates a contradiction. Vertical pairs of logic levels encircled by an ellipse indicate a state transition. The table is divided horizontally into two rows grouped as Case 1, four rows grouped as Case 2 and five rows grouped as Case 3.

The table establishes that the phase-frequency comparator of the invention is driven to one of three stable states (5), (6) or (7) by the reset pulse and hence will yield correct directional information immediately.

When following the curves and state changes, it should be remembered that the devices are negative-edge triggered. Also, in FIG. 8, E$p_1$ (curve B) represents a local oscillator frequency higher than QF (curve A) and E$p_2$ (curve C) an LOF lower than QF. Further a 0 on either the U or D output indicates a ramp control signal for producing an LOF frequency change in that direction, whereas a 1 on both the U and D outputs indicates a "no ramp change" condition.

Referring to the first line of the table in Fig. 9, and assuming Case 1 conditions ($\overline{DEp}$, QF and E$p$ all at 0) the logic levels of the various NANDS in the phase comparator may be calculated. With QF at 0, output ($a$) of NAND 330 is at 1. With E$p$ at 0, the output of NAND 340 ($f$) is at 1. With $\overline{DEp}$ at 0, outputs ($c$) and ($d$) of NANDS 334 and 336, respectively are at 1. Since ($a$) and ($c$) are both at 1, output ($b$) of NAND 332 is at 0. Similarly, output ($e$) of NAND 338 is at 0. Since ($a$) and ($b$) are 0 and 1 respectively, U is at 1. Similarly, D is at 1 since ($e$) and ($f$) are at different levels. Output ($g$) of NAND 334 is at 1. Case 1 represents the phase-frequency comparator being in stable state (5).

Assume now that $\overline{DEp}$ goes from 0 to 1 while QF and E$p$ are at 0. This change affects NANDS 334 and 336. One input of each is from output ($g$), which remains at 1, and another input of each is from outputs ($b$) and ($e$), respectively, which are both at 0. Hence the change in the $\overline{DEp}$ pulse from 0 to 1 does not affect the output states of NANDS 334 and 336 and the phase comparator remains in stable state (5).

Referring back to FIGS. 6 and 8, stable state (5) for the output conditions U and D at 1 (QF and E$p$ at 0) defines the condition of comparator 40 when the $\overline{DEp}$ occurs. If the frequency of E$p$ is higher than the frequency of QF, a negative edge transition in the E$p$ will occur before a negative edge transition in QF (see curves A and B). From curves A and B, the next change occurs when E$p_1$ goes to 1. Moving horizontally on the chart of FIG. 6 from stable state (5) with QF-E$p$ at 0—0 to QF-E$p$ at 0—1, unstable state 6 is reached. Moving vertically to stable state (6), it is seen that U and D remain at 1 and no direction signal is given.

The next change is that QF goes to 1. Moving horizontally from stable state (6) to the QF-E$p$ at 1—1 column encounters unstable state 7. The phase comparator rests in stable state (7) with its U and D outputs still at 1.

The next change is when E$p_1$ goes to 0. In moving horizontally to QF-E$p$ = 1—0, the phase comparator goes into stable state (12), via unstable state 12, corresponding to a D output at 0 and a U output at 1. Thus a ramp down signal is requested indicating that E$p_1$ is higher in frequency than QF.

It may be similarly shown that for curve C with an E$p_2$ that is too low in frequency, the phase comparator rests in stable state (2) corresponding to a ramp up signal. Note that no erroneous direction information occurred during this time. It should also be understood that each time a $\overline{DEp}$ pulse occurs, the sequence repeats itself and the first indication of directional information is correct.

For the Case 2 condition, $\overline{DEp_2}$ and QF are at 0, but E$p$ is at 1. ($a$) is at 1, ($c$) is at 1 and thus ($b$) is at 0. With ($a$) and ($b$) at opposite levels, output U is at 1 as is output (g). Output (d) is at 1 because $\overline{DEp_2}$ is at 0. At this point, an assumption must be made to determine the states of the remaining logic gates. Assume (as indicated by the square) that output (f) is at 1. Since (d) is at 1, (e) of NAND 338 must be at 0 (indicated by a diamond). With (e) at 0 and (f) at 1, output D must be at 1, (indicated by a diamond). However if D is at 1 and Ep is at 1, then both inputs to NAND 340 are at 1 and its output (f) must be at 0 — a contradiction of the assumption. Therefore the assumption is wrong and is so indicated by the X. Since (f) cannot be at 1, it must be at 0. With (f) at 0 and (d) at 1, (e) of NAND 338 must be at 1. D is at 1, because (f) is at 0. This is a stable condition, but not one defined in FIG. 6. When the reset pulse terminates $\overline{DEp_2}$ goes to 1. The only change is in (d) of NAND 336. Its inputs (e), $\overline{DEp}$ and (g) are all at 1 and its output (d) therefore goes to 0. The (f) and (d) inputs of NAND 338 are both at 0 and output (e) remains at 1. No further changes occur and the device is in its stable state (6), with both the U and D outputs at 1.

Referring to the chart in FIG. 6 and curves in FIG. 8, and assuming Ep is higher in frequency, curves A and B are defined. When $\overline{DEp_2}$ terminates, the next change is that QF goes to 1 which puts the phase comparator into stable state (7) under QF-Ep at 1-1. Thereafter Ep goes to 0 and the comparator goes to stable state (12) with D going to 0 indicating a downward change in frequency is needed.

If Ep were lower in frequency (curve C), QF would go to 1, putting the comparator into stable state (7) and then QF would return to 0, putting the comparator into stable state (2) producing a U at 0 output condition indicating the need for an upward change in frequency.

Finally for Case 3, both QF and Ep are at 1 and $\overline{DEp_3}$ is at 0. By inspection, outputs (c) and (d) are at 1. At this point, it is necessary to make an assumption. It is assumed that output (f) is at 1. If (f) is at 1 and Ep is at 1 then D must be 0 (indicated by the diamond), and (e) and (g) must be at 1. Since two inputs (f) and (d) to NAND 338 are at 1 and its output (e) must be 0, it obviously cannot be at 1. Consequently, the assumption leads to a contradiction and must be false. In the second line, output (f) is 0, D is 1 and outputs (e) and (g) are 1. At this point, another assumption needs to be made. It is assumed that output (a) of NAND 330 is at 1. With QF at 1 and (a) at 1, U must be 0 (diamond) and all inputs to NAND 342 must be at 1. Thus (b) must be at 1 (diamond). But if (a) and (c) are at 1, (b) must be at 0 and the assumption is false. Thus (a) is at 0 (third line), U is at 1 and (b) is at 1. This is a stable condition, but is not one of the stable states shown in FIG. 6.

Assuming now that $\overline{DEp_3}$ changes from 0 to 1, it can be shown that the only change is in outputs (c) and (d) of NAND's 334 and 336. Outputs (c) and (d) go to 0 and outputs (b) and (e) remain at 1. The comparator is now in stable state (7).

Referring to the chart in FIG. 6 and curves in FIG. 8 and assuming Ep is higher in frequency, curves A and B are defined. When $\overline{DEp_3}$ terminates, the change is that Ep goes to 0 which puts the phase comparator into stable state (12) with D=0, indicating a downward change in frequency is needed.

If Ep were lower in freqeuncy (curve C), the next change is that QF goes to 0 and the comparator goes to stable state (2), producing a U at 0 output condition, indicating the need for an upward change in frequency.

It can be proven that once Ep and QF have been reset and the phase-frequency detector has been simultaneously reset to stable states (5), (6) or (7), a fixed frequency Ep (and obviously a fixed frequency QF) will produce accurate output directional information. The proof is somewhat long and will not be included for the sake of brevity. Suffice it to say that in accordance with the invention, accurate output information is available immediately from the phase detector.

In the described preferred embodiment, the phase-frequency detector is reset at regular intervals and its output condition monitored until a reversal of U and D occurs, which indicates that the relationship between Ep and QF has reversed. Consequently, the LOF must have gone beyond the "correct" tuning point.

As is fully explained in the copending referent application, this "overshoot" is detected and the tuning cycle control terminates full ramp operation in favor of PLL operation.

What has been described is a novel phase-frequency comparator which instantly yields accurate information relative to the frequency difference between a reference frequency input and a controllable frequency input.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. A digital phase-frequency comparator comprising a plurality of interconnected logic gates having a first input for receiving an adjustable pulse signal, a second input for receiving a reference pulse signal and first and second outputs selectively indicating the frequency-phase relationship between the adjustable signal and reference signal;

said phase-frequency comparator having a plurality of both stable states and unstable states, and often temporarily producing erroneous output information; and reset means for instantaneously forcing said phase-frequency comparator into one of its stable states such that said outputs present correct information about the frequency relationship between said adjustable pulse signal and said reference pulse signal within one cycle of the higher frequency one of said pulse signals.

2. A digital phase-frequency comparator as set forth in claim 1, wherein said reset means initially force said adjustable pulse signal and said reference pulse signal to have the same phase.

3. A digital phase-frequency comparator as set forth in claim 2, wherein said reset means provide a reset pulse signal for simultaneously driving said phase-frequency comparator to a given stable state while forcing said adjustable and reference pulse signals to have the same phase.

4. A digital phase-frequency comparator as set forth in claim 3, wherein said reset pulse signal is a subharmonic of said adjustable pulse signal.

5. The method of achieving immediate correct directional information from a digital phase-frequency comparator having a plurality of interconnected logic gates for determining the frequency and then the phase of an adjustable pulse signal with respect to a reference pulse signal within one cycle of the higher frequency signal comprising the steps of:

forcing said signals into an equal phase relationship to enable said comparator to determine frequency information; and setting said comparator to the stable state corresponding to the desired ultimate output indication.

6. The method of claim 5 wherein said forcing step includes the steps of:
generating a reset pulse signal as a subharmonic of said adjustable pulse signal; and
applying said reset pulse signal to selected gates of said phase-frequency comparator.

* * * * *